United States Patent
Wyville

(10) Patent No.: US 8,618,969 B2
(45) Date of Patent: Dec. 31, 2013

(54) LOW COMPLEXITY HIGH-SPEED MULTI-DAC SYSTEM

(75) Inventor: Mark Wyville, Ottawa (CA)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 0 days.

(21) Appl. No.: 13/414,406

(22) Filed: Mar. 7, 2012

(65) Prior Publication Data

US 2013/0234873 A1    Sep. 12, 2013

(51) Int. Cl.
*H03M 1/66* (2006.01)

(52) U.S. Cl.
USPC .................................. 341/144; 375/295

(58) Field of Classification Search
USPC ............ 341/144, 118, 68; 375/295, 298, 308, 375/350, 373
See application file for complete search history.

(56) References Cited

U.S. PATENT DOCUMENTS

| | | | |
|---|---|---|---|
| 5,521,946 A * | 5/1996 | Main ............................. | 375/350 |
| 6,411,645 B1 | 6/2002 | Lee et al. | |
| 7,369,078 B2 | 5/2008 | Nickel et al. | |
| 7,372,386 B1 | 5/2008 | Maloberti et al. | |
| 7,504,976 B1 | 3/2009 | Pellon | |
| 2002/0140593 A1 * | 10/2002 | Eshraghi et al. .............. | 341/144 |

OTHER PUBLICATIONS

Balasubramanian, S. et al. "Direct Digital-to-RF Digital-to-Analogue Converter using Image Replica and Nonlinearity Cancelling Architecture." Electronics Letters, vol. 46, No. 14, Jul. 8, 2010.
Deveugele, J. et al. "Parallel-Path Digital-to-Analog Converters for Nyquist Signal Generation." IEEE Journal of Solid-State Circuits, vol. 39, No. 7, Jul. 2004.
Krall, C. et al. "Time-Interleaved Digital-to-Analog Converters for UWB Signal Generation." IEEE International Conference on Ultra-Wideband, Sep. 24-26, 2007.
Vanzeijl, P. T. M. et al. "On the Attenuation of DAC Aliases through Multiphase Clocking." IEEE Transactions on Circuits and Systems—II: Express Briefs, vol. 56, No. 3, Mar. 2009.
Domanin, D., et al., "A Multipath Polyphase Digital-to-Analog Converter for Software Radio Transmission Systems," ISCAS 2000— IEEE International Symposium on Circuits and Systems, May 28-31, 2000 pp. 361-364, vol. 2, Geneva, Switzerland.

* cited by examiner

*Primary Examiner* — Joseph Lauture
(74) *Attorney, Agent, or Firm* — Murphy, Bilak & Homiller, PLLC

(57) ABSTRACT

A multi-DAC system includes a plurality of DACs arranged in parallel for converting a digital signal to an analog signal, each DAC path having a different analog phase response. The system further includes a circuit for multiplying the digital signal input to at least some of the DACs by a multiplicand sufficient to shift a peak of a frequency response of the multi-DAC system to a non-DC frequency. For example, a series of +1 and/or −1 digital values can be used to multiply the digital signal so that the signal has the same number of bits pre and post multiplication. The multiplicand can include a constant series of +1 or −1 digital values, or a time-varying series of +1 and −1 digital values. In each case, the peak frequency response of the multi-DAC system can be shifted away from DC to a multiple of the sampling frequency of the DACs.

26 Claims, 12 Drawing Sheets

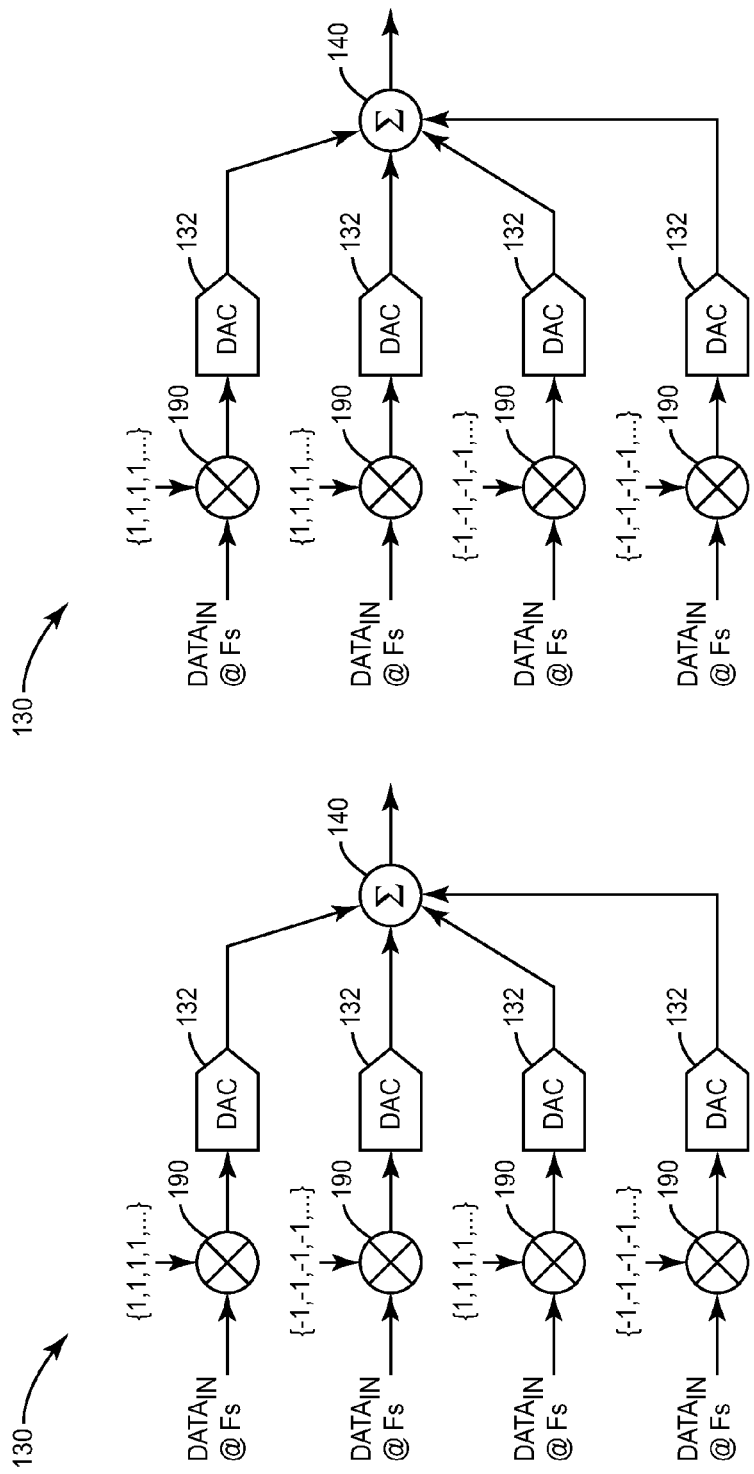

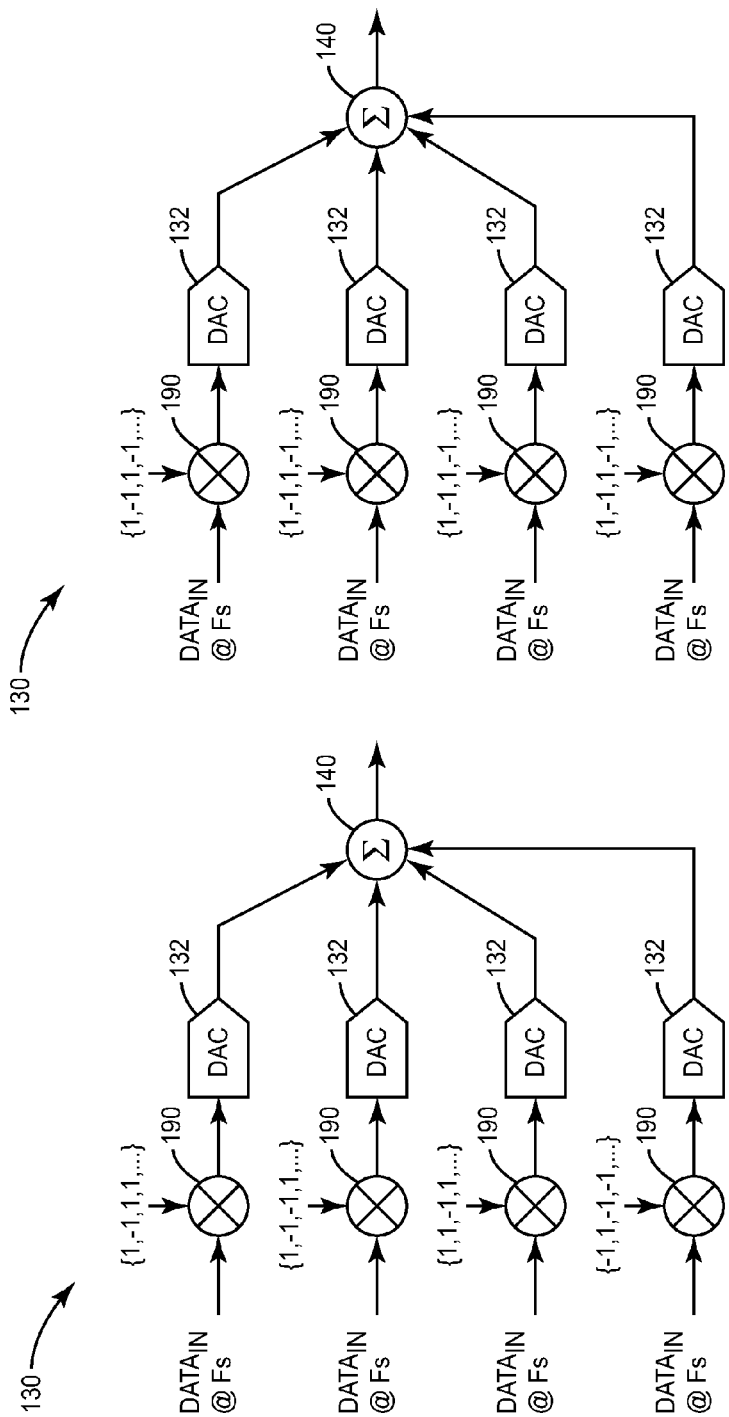

LOW COMPLEXITY HIGH-SPEED MULTI-DAC SYSTEM

BACKGROUND

The present invention generally relates to digital-to-analog converter (DAC) systems, and more particularly relates to low complexity and high-speed multi-DAC systems.

Digital processors are used in modern telecommunication devices to perform complex processing, while adhering to reasonable power and size constraints. In order to transfer information to another radio the digital signals are first converted into analog signals. This conversion process is performed by a digital-to-analog converter.

High-speed DACs are used to transmit at high data rates, and permit moving some of the traditional analog functionality of a radio system into the digital domain e.g. such as frequency up-conversion. One technique to improve the sampling rate of a DAC system is to use multiple DACs in parallel. However slower DACs have undesired images not normally present in the first Nyquist zone of a single faster DAC, therefore requiring the slower DACs to work together to eliminate the undesired images.

A parallel DAC architecture typically includes multiple DACs whose outputs are combined in the analog domain. Most high-speed DACs have current outputs. Devices with current outputs can be combined by directly connecting their outputs.

The frequency spectrum of an oversampled digital signal has related images, meaning that the images cannot be independently adjusted in magnitude or phase. If the analog frequency responses of the DAC paths are identical in a parallel DAC architecture, then suppressing one image would suppress all images. To avoid this undesirable outcome, each parallel DAC path must exhibit a different phase response in the analog domain to permit attenuation of only the undesired images. Multi-phased clocking is used so that each DAC exhibits a different phase response in the analog domain, and so that no components are connected to the DAC outputs (i.e. permitting direct connection of the DAC outputs). With multi-phased clocking, a clock with different phase offsets is provided to each DAC. Uniform clock phase offsets are generally applied.

Multi-DAC systems with multi-phase clocking can be modeled mathematically as an FIR system with equal magnitude taps operating at $N*Fs$, where N is the number of parallel DACs and Fs is the sampling frequency of the DACs. Such a system is equivalent to using a rectangular window in the time domain of length N. The rectangular window results from using parallel multi-phased DACs with identical paths. The frequency response of the rectangular window has a lowpass filter characteristic with a passband bandwidth which decreases as the number of DACs increase.

The lowpass filter characteristic of conventional multi-DAC systems with multi-phase clocking is problematic. This characteristic can effectively limit the output signal of the multi-DAC system to be between 0 and Fs/2, which is the frequency range of a single slower DAC. As an example, if the desired signal is near $\frac{3}{8}N*Fs$, then the desired image can be 20 to 30 dB smaller than if it were centered at DC. This difference in gain is typically compensated e.g. using a precoding filter, but compensating gain variation this large is undesirable. The problem is exacerbated when a repeater is used for up-sampling and has the same frequency response as the rectangular window function, by applying the frequency response twice. Conventional multi-DAC systems which use multi-phased clocking with uniform phase offsets cannot generate an output signal beyond Fs/2, without compensation which can vary over tens of dBs.

SUMMARY

A low complexity high-speed multi-DAC system is described herein which includes a plurality of DACs arranged in parallel for converting a digital signal to an analog signal, each DAC path having a different analog phase response. The multi-DAC system further includes a circuit which multiplies the digital signal input to at least some of the DACs by a multiplicand sufficient to shift the peak of the frequency response of the multi-DAC system to a non-DC frequency. For example, a multiplicand including a series of +1 and −1 digital values can be used to multiply the digital input signal. According to this embodiment, the digital input signal has the same number of bits pre and post multiplication. The multiplicand can include a constant series of +1 and/or −1 digital values, or a time-varying series of +1 and −1 digital values. In each case, the peak frequency response of the multi-DAC system is shifted away from DC to some integer or non-integer multiple of the sampling frequency of the DACs.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 4 to 11 are block diagrams of additional embodiments of a multi-DAC system.

DETAILED DESCRIPTION

Figure 1:
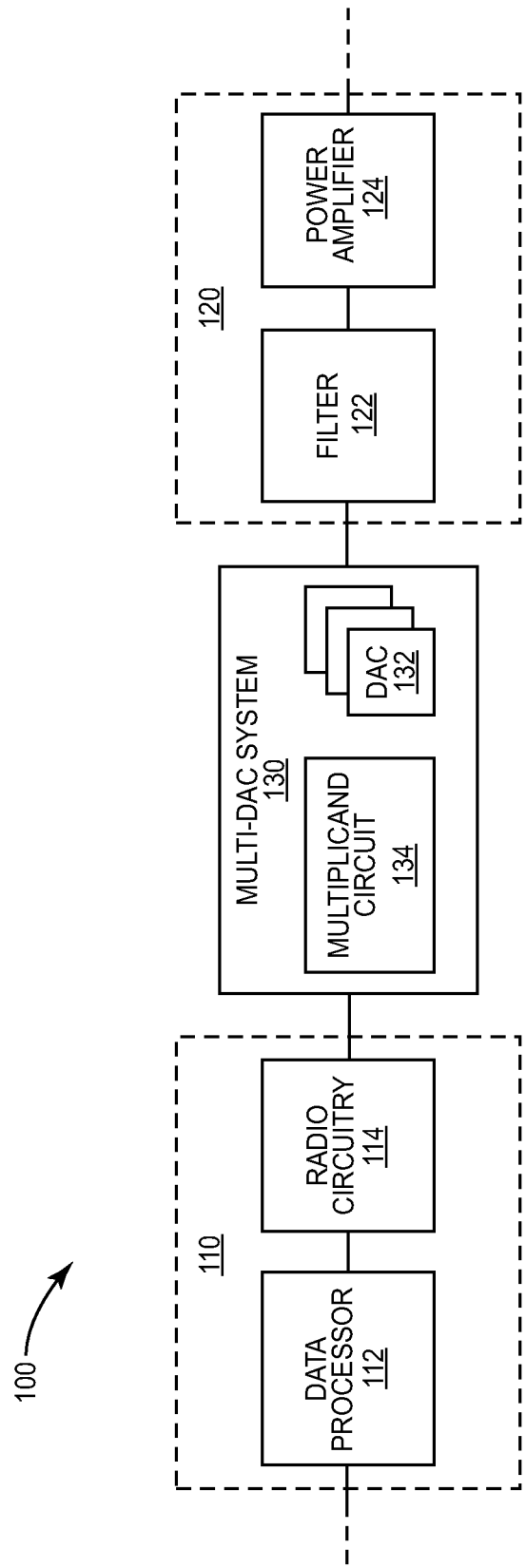
FIG. 1 is a block diagram of an embodiment of a telecommunication device with a multi-DAC system.

As a non-limiting example, FIG. 1 illustrates a partial view of a telecommunication device 100 which has a digital section 110, an analog section 120 and a multi-DAC (digital-to-analog converter) system 130 for interfacing between the digital and analog sections 110, 120. The digital and analog sections 110, 120 can contain any components typically included in a conventional telecommunication device. For example, the digital section 110 can include a data processor 112 such a DSP (digital signal processor), ASIC (application-specific integrated circuit) and/or FPGA (field programmable gate array), and digital radio circuitry 114 such as a digital frequency up-converter. The digital radio circuitry 114 can be implemented as part of a DSP. The analog section 120 can include a filter 122 and a power amplifier 124, and also e.g. up-conversion circuitry (not shown) if frequency up-conversion is not performed by the digital section 110. The multi-DAC system 130 converts between digital signals from the digital section 110 to corresponding analog signals toward the analog section 120.

The multi-DAC system 130 includes a plurality of DACs 132 arranged in parallel for converting a digital signal from the digital section 110 to an analog signal provided to the analog section 120. Each DAC path has a different analog phase response. This can be achieved by using multi-phase clocking to control operation of the DACs 132. The inputs or outputs of the DACs 132 can be delayed (phase shifted) with respect to each other to ensure each DAC path has a different analog phase response.

The multi-DAC system 130 further includes a circuit 134 for multiplying the digital signal input to at least some of the DACs 132 by a multiplicand which shifts a peak of the frequency response of the multi-DAC system 130 to a non-DC frequency. The circuit 134 is also referred to interchangeably herein as multiplicand circuit. The multiplicand circuit 134 can be implemented as part of the data processor 112 included in the digital section 110 of the device 100. For example, the data processor 112 can implement the digital signal multiplication techniques described herein. Alternatively, the multiplicand circuit 134 is implemented separate from the data processor 112.

Unlike conventional multi-DAC systems which have a peak frequency response at DC, the multi-DAC system 130 described herein has a peak frequency response which is shifted away from DC to an integer or non-integer multiple of the sampling frequency (Fs) of the DACs 132. Doing so yields a rectangular window function with a frequency response devoid of the lowpass filter characteristic typically inherent in conventional multi-DAC systems, without the use of gain compensation. The peak of the frequency response can be moved to any desired non-DC frequency by adjusting the multiplicand applied to the digital signal as described in more detail later herein.

Figure 2:
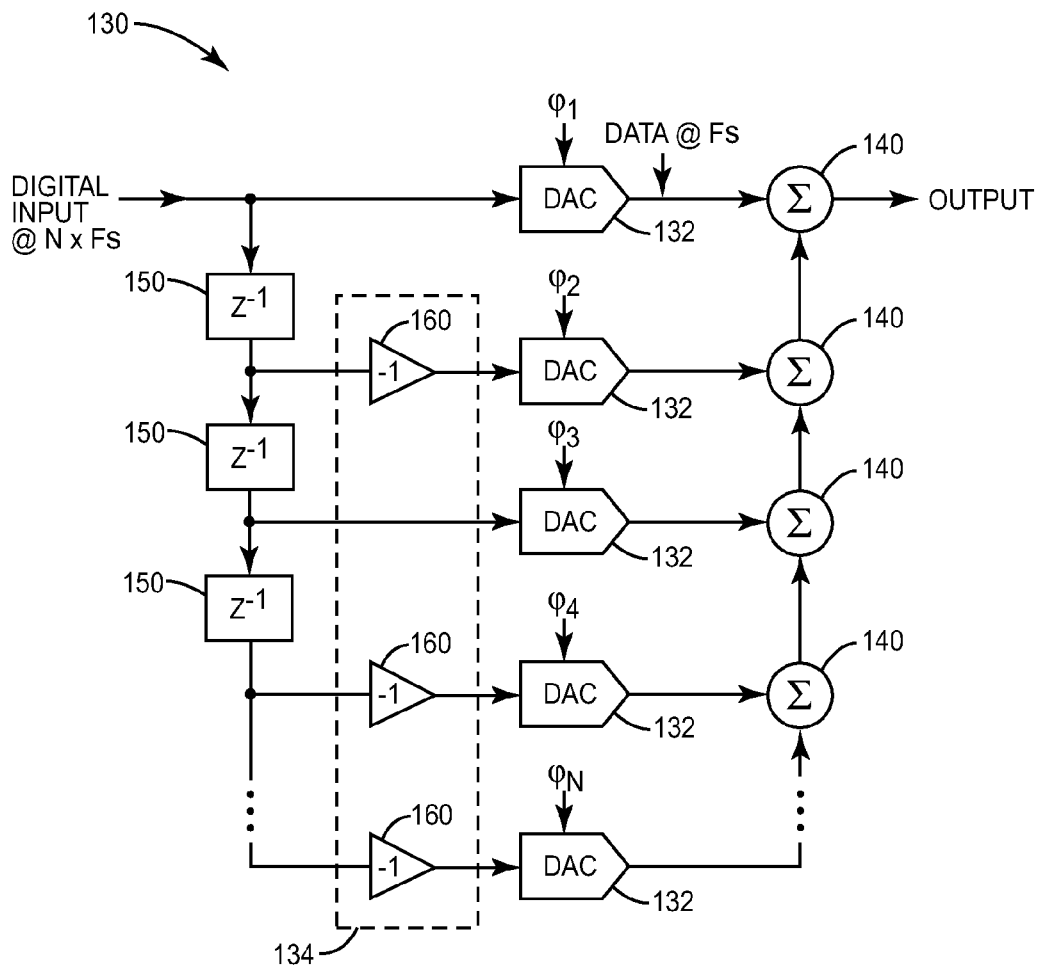
FIG. 2 is a block diagram of an embodiment of a multi-DAC system.

FIG. 2 illustrates one embodiment of the multi-DAC system 130. The multi-DAC system 130 includes N DACs 132 coupled in parallel. A clock with different phase offsets ($\phi_1$, $\phi_2$, ..., $\phi_N$) is applied to each DAC 132 for operating the DACs. The clock phase offsets can be uniform, if desired. The analog DAC outputs are combined by one or more summers (combiners) 140 to form an analog signal output ('output') provided to the analog section 120 of the telecommunication device 100. The digital signal input ('Digital input')) to the multi-DAC system 130 has a sample frequency of N*Fs, where N is the number of DACs 132 coupled in parallel and Fs is the sampling frequency of each DAC 132. Each DAC 132 performs decimation according to this embodiment (by a factor of N).

During operation, the first (highest order) DAC 132 receives the digital signal input without delay. Each successive DAC input is delayed by a delay element 150. The delay elements 150 in conjunction with the DACs 132 form a kind of FIR (finite impulse response) filter. The frequency response of the FIR filter can be shifted by inserting one or more multipliers 160 between certain ones of the tap delays 150 and the corresponding DAC inputs. Each multiplier 160 multiplies the corresponding delayed digital input signal by −1 in the digital domain. By choosing the appropriate DAC inputs to multiply by −1, the peak of the frequency response of the multi-DAC system 130 can moved from DC to any suitable integer or non-integer multiple of Fs (the sampling frequency of the DACs 132). For example, M consecutive digital input samples in effect can be multiplied by +1 to pass these samples and the next M consecutive input samples can be multiplied by −1 to shift the peak frequency response of the multi-DAC system 130. The multiplication pattern repeats indefinitely, and the location of the peak of the magnitude response is located at 0.5*N*Fs/M in the frequency domain.

Figure 3:
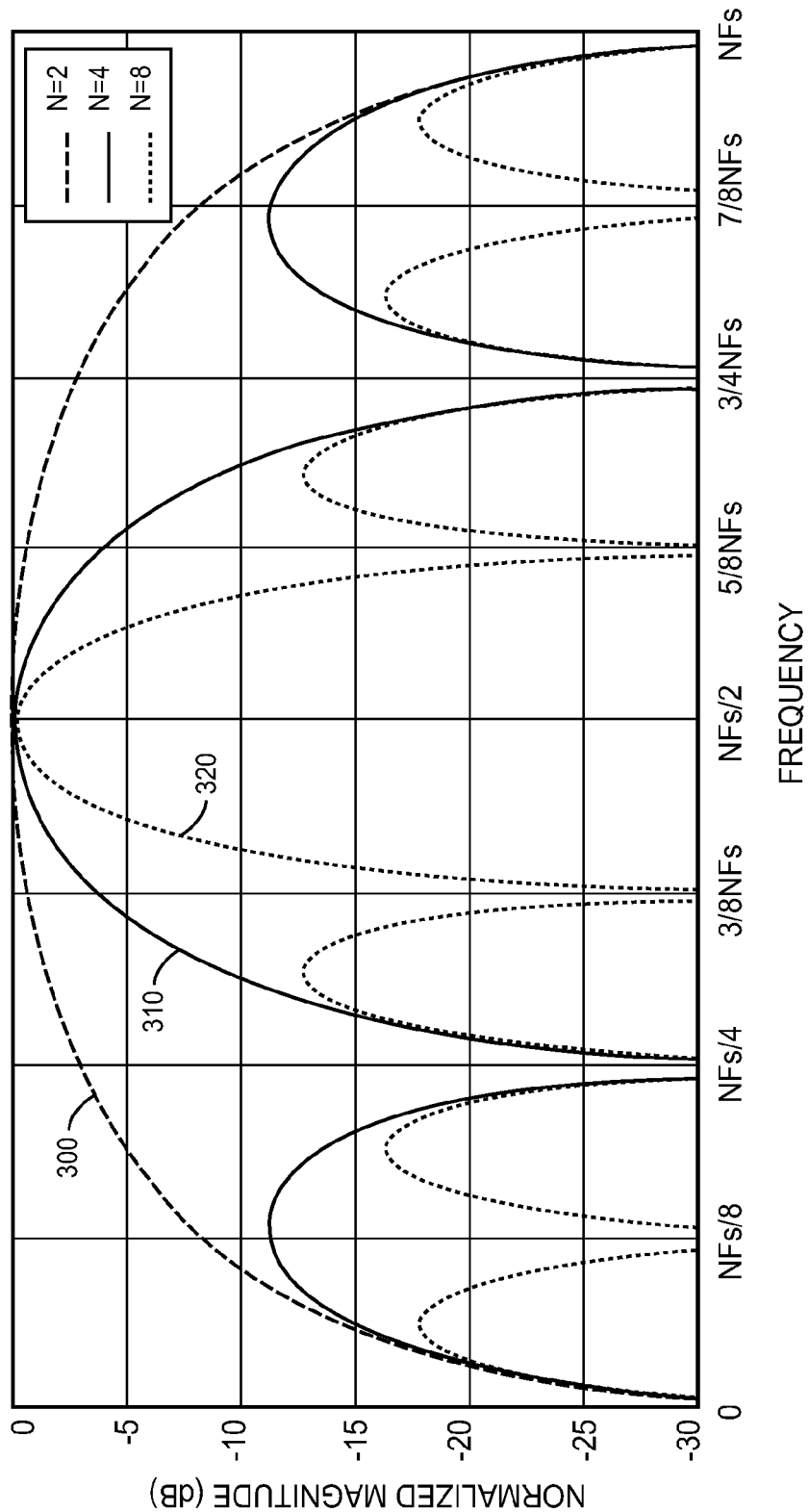
FIG. 3 is a plot diagram of the frequency response of the multi-DAC system of FIG. 2 for different numbers of DACs connected in parallel.

FIG. 3 for example shows the peak frequency response of the multi-DAC system 130 centered at N*Fs/2 for N=2 DACs 132 (curve 300), N=4 DACs 132 (curve 310) and N=8 DACs 132 (curve 320). Multiplying by −1 can be readily implemented in digital hardware e.g. using inverters. In one embodiment, multiplying every other successive DAC input by −1 as shown in FIG. 2 moves the peak of the magnitude response from 0 to N*Fs/2 as shown in FIG. 3. The multiplicand circuit 134 in this case includes the −1 multipliers 160. In this case, the multiplicand is selected so that the digital input signal has the same number of bits pre and post multiplication. That is, by selecting the multiplicand to comprise a series of +1 and −1 digital values, the digital input signal has the same number of bits pre and post multiplication so wider signal buses and wider DACs are not required post multiplication. However, other multiplicand values can be used if desired. In each case, the multiplicand is selected so that the peak of the frequency response of the multi-DAC system is shifted from DC to an integer or non-integer multiple of Fs (the sampling frequency of the DACs 132).

Figure 4:
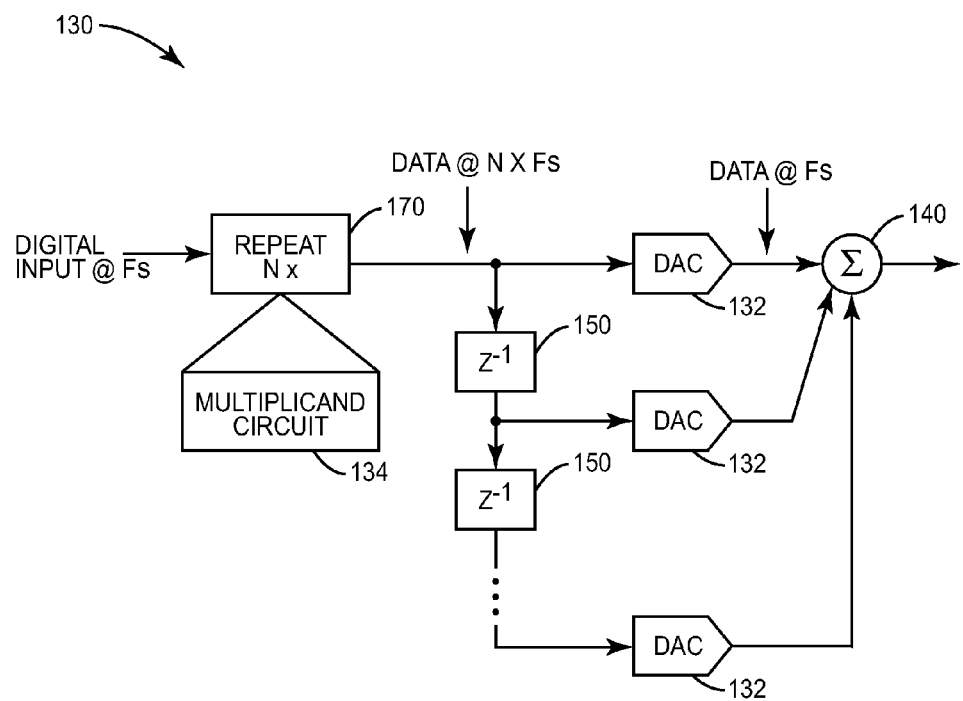

FIG. 4 illustrates another embodiment of the multi-DAC system 130. The multi-DAC system 130 shown in FIG. 4 is similar to the embodiment shown in FIG. 2. However a repeater 170 is provided for up-sampling the incoming digital signal, which is at the DAC sampling frequency Fs and not N*Fs, by a factor of N so that the data input signal has a sampling frequency of N*Fs after up-sampling. Any conventional repeater can be used. Alternatively, an interpolator with different polyphase filters can be used to perform the up-sampling. In each case, the multiplicand circuit 134 is included in or associated with the repeater (or interpolator) for shifting the peak of the frequency response of the multi-DAC system 130 to a non-DC frequency. For example, applying +1 and −1 multiplications to the repeat function as shown in FIG. 4 is equivalent to applying such multiplications directly to the DAC inputs as shown in FIG. 2. In each case, the DACs 132 decimate the corresponding incoming digital signal and convert the decimated samples to the analog domain for processing by the analog section 120 of the telecommunication device 100.

Figure 5:
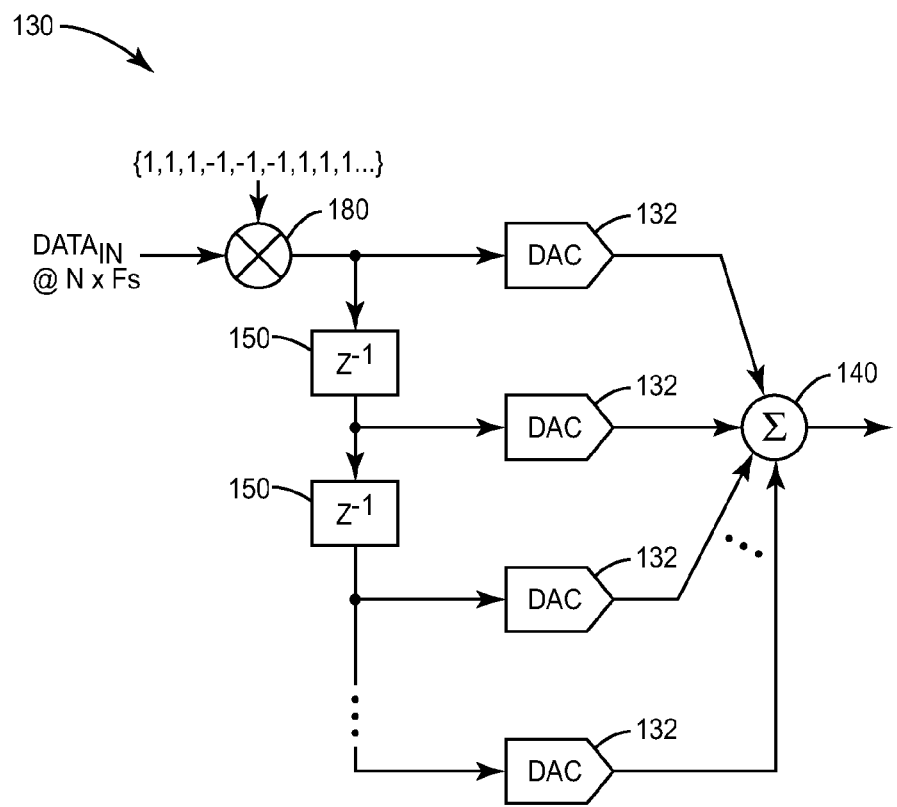

FIG. 5 illustrates yet another embodiment of the multi-DAC system 130. The digital signal (data$_{in}$) is input to the multi-DAC system 130 at a sampling frequency of N*Fs as is the case with the embodiment of FIG. 2, however the multiplicand circuit 134 comprises a single multiplier 180 which inputs the digital signal at N*Fs and alternates between multiplying each successive group of M consecutive input samples by a digital value of +1 or −1. The multiplied digital samples are output from the single multiplier 180 toward the DACs 132. The single +1/−1 multiplier 180 performs all of the necessary multiplications, and runs at a rate of N*Fs. The multiplicand sequence identified in the bracket above the single multiplier 180 in FIG. 5 is for the case of M=3. Of course, other values of M can be used if desired. In general the choice of N and M determines the position of the peak of the frequency response of the multi-DAC system 130 in accordance with 0.5*N*Fs/M, as previously described herein.

Figure 6:
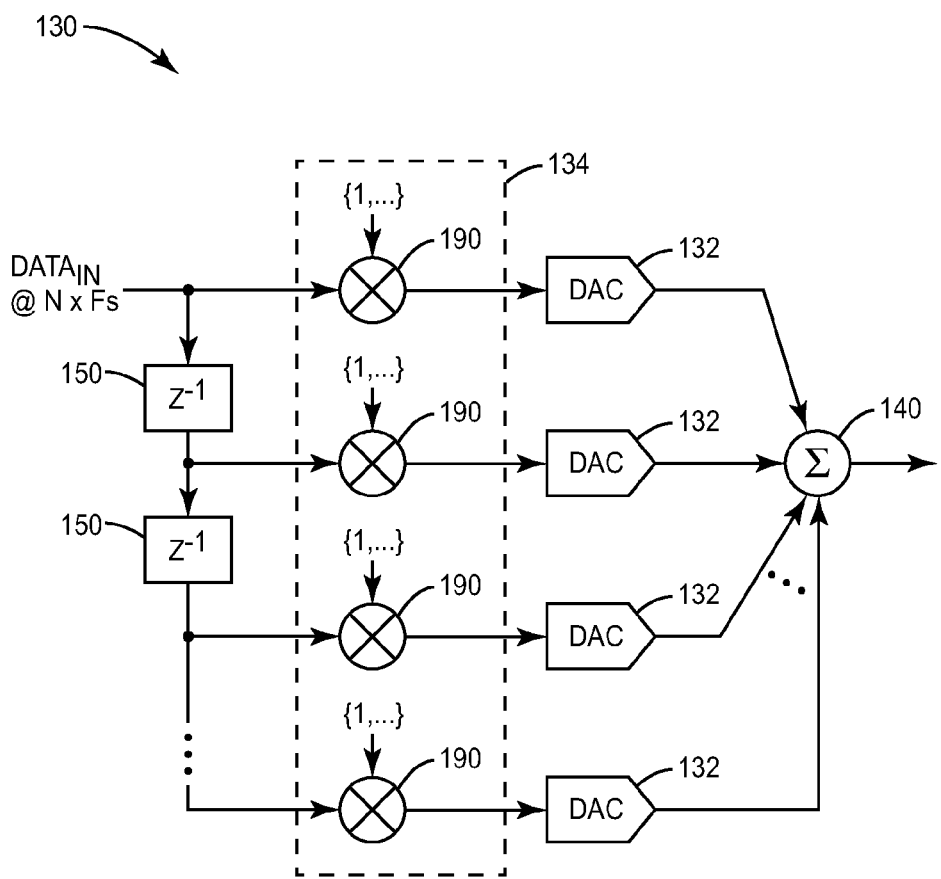

FIG. 6 illustrates an embodiment of the multi-DAC system 130 which is similar to the embodiment shown in FIG. 5, except the multiplications (indicated by separate brackets) are distributed to the N DAC inputs instead of being performed by a single multiplier. According to the embodiment shown in FIG. 6, delayed versions of the same digital input data (data$_{in}$) are sent to the DAC paths at a rate of N*Fs and the multiplicand circuit 134 comprises a different multiplier 190 coupled to each of the N DACs 132. Each of the multipliers 190 input the digital signal or a delayed version of the digital signal at a sampling frequency of Fs and alternates between multiplying each successive group of M consecutive input samples by a digital value of +1 or −1 as previously described herein. Unlike the single multiplier 180 shown in FIG. 5 which operates at N*Fs, the individual multipliers 190 shown in FIG. 6 only need to run at a rate equal to Fs since Fs is the sampling rate of the N DACs 132.

Figure 7:
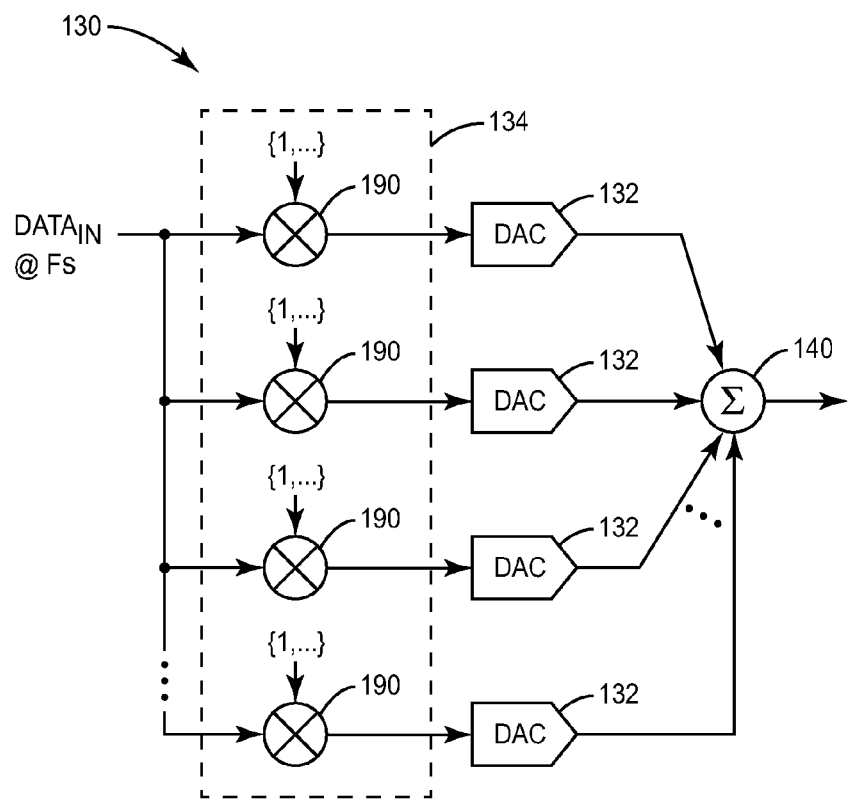

FIG. 7 illustrates an embodiment of the multi-DAC system 130 which is similar to the embodiment shown in FIG. 6, except the same digital input data (data$_{in}$) is sent to each DAC path at a rate of Fs instead of N*Fs and there are no delay lines. Each multiplier 190 inputs the same version of the digital signal at Fs, and multiplies each successive group of M consecutive input samples by a constant multiplicand comprising +1 and/or −1 digital values (indicated by separate brackets) to provide the desired peak frequency response shifting.

Figure 8:
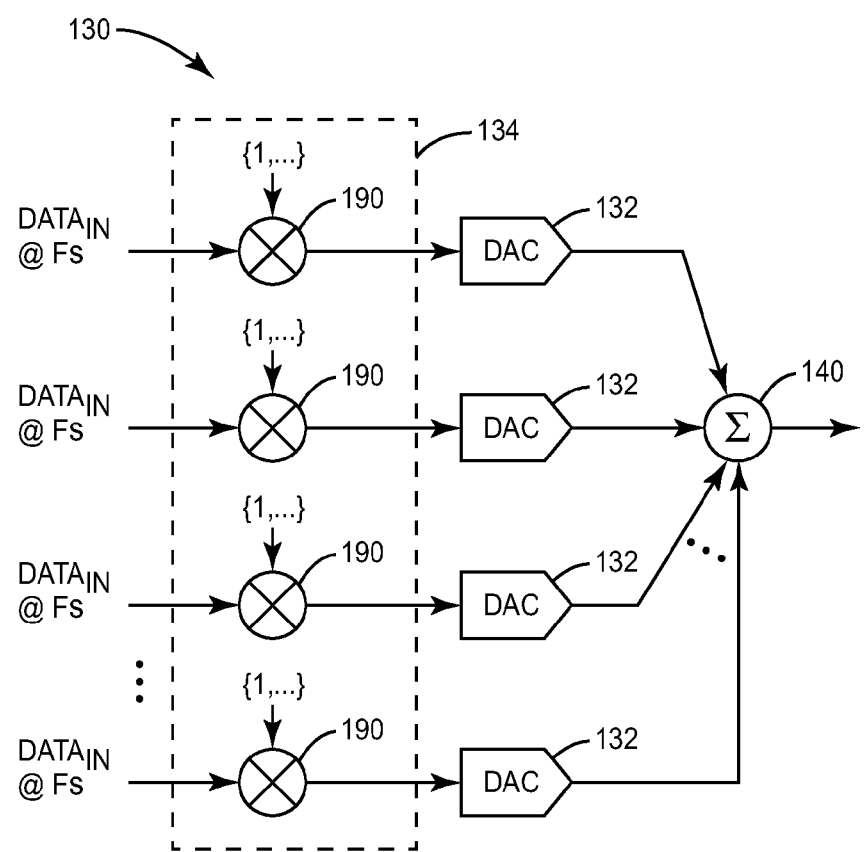

FIG. 8 illustrates an embodiment of the multi-DAC system 130 which is similar to the embodiment shown in FIG. 7, except the digital data (data$_{in}$) comes from N polyphase filters of an interpolator. Each multiplier 190 inputs a filtered version of the digital signal at Fs, and multiplies each successive group of M consecutive input samples by a constant multiplicand comprising +1 and/or −1 digital values (indicated by separate brackets). In both embodiments of FIGS. 7 and 8, the peak of the frequency response of the multi-DAC system 130 again occurs at 0.5*N*Fs/M.

Some values of N and M result in multiplicand sequences that are constant, and therefore can be replaced with a constant digital value. However, other values of N and M result in the multiplicands which are time-varying to ensure each block of M successive digital input samples is multiplied by appropriate alternating values of +1 and −1. FIGS. 9A to 9D illustrate different embodiments of the multi-DAC system 130 where as an example, N=4 and different values of M are employed.

In FIG. 9A, M=1 is used. Accordingly, the digital input signal (data$_{in}$) to the multi-DAC system 130 is multiplied by +1 (first value in the multiplicand sequence of the first multiplier 190), the second sample is multiplied by −1 (first value in the multiplicand sequence of the second multiplier 190), the third sample is multiplied by +1 (first value in the multiplicand sequence of the third multiplier 190), and so forth. Each multiplier 190 therefore has a multiplicand sequence (in brackets) of identical values (+1 or −1) as shown in FIG. 9A. FIG. 9B shows the scenario of N=4 and M=2. As with the scenario shown in FIG. 9A, the multiplicand (in brackets) used by each multiplier 190 has a sequence of identical values (+1 or −1) albeit different from the identical multiplicand sequences shown in FIG. 9A. In both cases, the multiplicand sequences can be replaced with a respective constant (+1 or −1).

FIG. 9C shows the scenario of N=4 and M=3, and FIG. 9D shows the scenario of N=4 and M=4. In FIGS. 9C and 9D, the multiplicand sequences (in brackets) are time-varying sequences of +1 and −1 digital values based on N and M and therefore cannot be replaced with a constant.

In some cases, the digital signal may be a multi-channel signal where there is more than one input signal and each input signal is to be output at a different frequency. If the output frequencies are closely spaced then the signals can be combined and the same multipliers used on the combined signals e.g. in accordance with the embodiments previously described herein except the input signal includes a combination of multiple channels. Under these conditions, each multiplier inputs the same version of the different channels or a filtered version of the different channels at the sampling frequency of N*Fs or Fs, and multiplies each successive group of M consecutive input samples of each channel by the same multiplicand input to the multiplier for each channel. The samples of the different channels are output post multiplication to the corresponding DAC at different frequencies. When the multi-channel input signals are to be output at frequencies that are sufficiently separated, then the multiplications previously described herein should be performed separately on the different signals.

Figure 10:
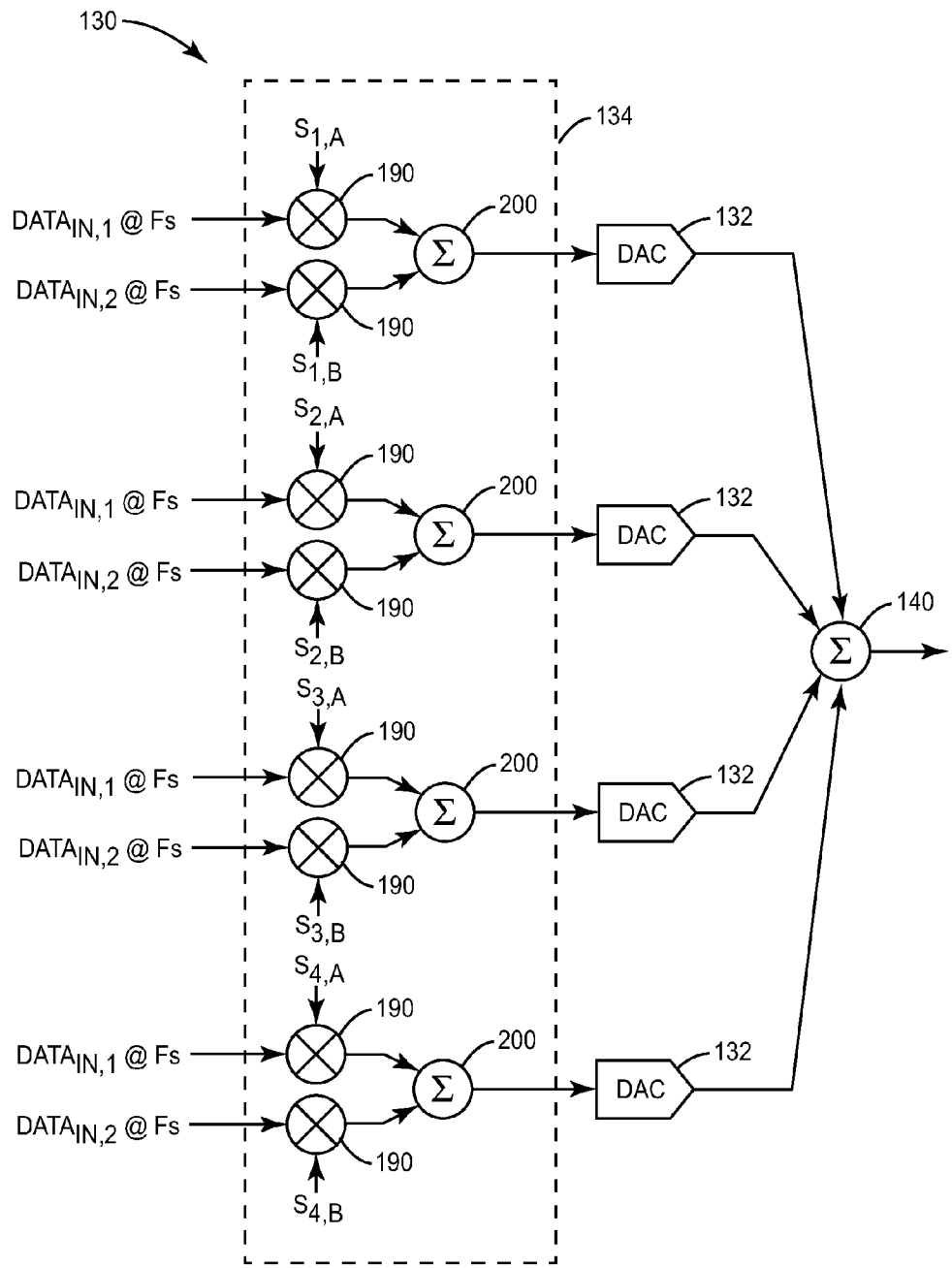

FIG. 10 illustrates an embodiment of the multi-DAC system 130 for a dual-channel scenario, where the multi-channel input signals (data$_{in,1}$ and data$_{in,2}$) are to be output at frequencies that are sufficiently separated. The multiplicand sequences are indicated using the variable S, with subscripts A and B indicating channels 1 and 2, respectively. According to this embodiment, each multiplier 190 of the multiplicand circuit 134 inputs the same version of the different channels or a filtered version of the different channels at the sampling frequency of Fs and multiplies each successive group of M consecutive input samples of each channel by a different channel-dependent multiplicand ($S_{x,A}$ or $S_{x,B}$) input to the multiplier 190 for each channel. The samples of the different channels are combined by a corresponding signal combiner 200 and output post multiplication to the corresponding DACs 132 at different frequencies.

Figure 11:
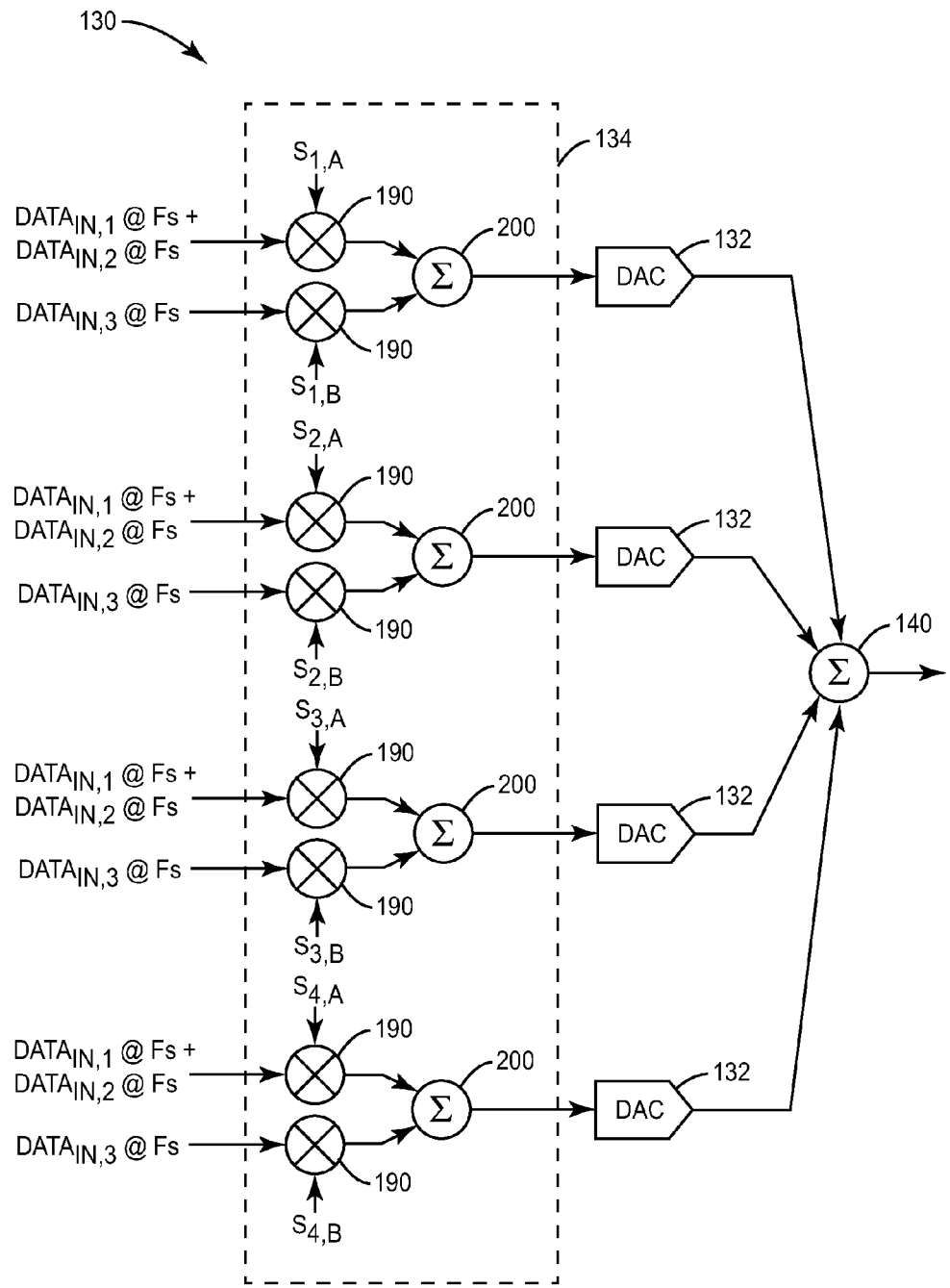

FIG. 11 illustrates an embodiment of the multi-DAC system 130 in which two data channels (data$_{in,1}$ and data$_{in,2}$) have closely spaced output frequencies, and are combined and processed with the same multiplicands ($S_{x,A}$) as described above. The third data channel (data$_{in,3}$) has an output frequency sufficiently separated from that of the first two data channels e.g. as described above with reference to the embodiment shown in FIG. 10. Accordingly, the third data channel (data$_{in,3}$) is processed with different multiplicands ($S_{x,B}$) than the other two data channels. The multi-DAC embodiments described herein can be readily extended to any number of multi-channel data signals.

According to the embodiments described herein, a multi-DAC system is provided which outputs a signal greater than Fs/2 without using a gain compensation system.

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A multi-digital-to-analog converter (DAC) system, comprising:
  a plurality of DACs arranged in parallel and operable to convert a digital signal to an analog signal, each DAC path having a different analog phase response; and a circuit operable to multiply the digital signal input to at least some of the DACs by a multiplicand sufficient to shift a peak of a frequency response of the multi-DAC system to a non-DC frequency.

2. A multi-DAC system according to claim 1, wherein the multiplicand is selected so that the digital signal has the same number of bits pre and post multiplication.

3. A multi-DAC system according to claim 1, wherein each DAC has the same sampling frequency (Fs) and the multiplicand is selected so that the peak of the frequency response of the multi-DAC system is shifted to an integer or non-integer multiple of Fs.

4. A multi-DAC system according to claim 3, wherein the multiplicand is selected so that the peak of the frequency response of the multi-DAC system occurs at N*Fs/2/M, where N corresponds to the number of DACs coupled in parallel.

5. A multi-DAC system according to claim 1, wherein the multiplicand comprises a series of +1 and/or −1 digital values.

6. A multi-DAC system according to claim 1, wherein the circuit is implemented as part of a processor, ASIC or FPGA.

7. A multi-DAC system according to claim 1, wherein:
the circuit comprises a single multiplier operable to input the digital signal at a sampling frequency of N*Fs, alternate between multiplying each successive group of M consecutive input samples by a digital value of +1 or −1 and output the samples post multiplication toward the plurality of DACs;
the peak of the frequency response of the multi-DAC system occurs at 0.5*N*Fs/M;
N corresponds to the number of DACs coupled in parallel; and
Fs corresponds to the sampling frequency of the plurality of DACs.

8. A multi-DAC system according to claim 1, wherein:
the circuit comprises a plurality of multipliers each of which is coupled to a different one of the plurality of DACs, each multiplier being operable to input the digital signal or a delayed version of the digital signal at a sampling frequency of Fs, alternate between multiplying each successive group of M consecutive input samples by a digital value of +1 or −1 and output the samples post multiplication to the corresponding DAC;
the peak of the frequency response of the multi-DAC system occurs at 0.5*N*Fs/M;
N corresponds to the number of DACs coupled in parallel; and
Fs corresponds to the sampling frequency of the plurality of DACs.

9. A multi-DAC system according to claim 8, wherein the digital signal comprises at least two different channels, and wherein each multiplier is operable to input the at least two different channels or a delayed version of the at least two different channels at the sampling frequency of Fs, alternate between multiplying each successive group of M consecutive input samples of each channel by the same digital value of +1 or −1 for each channel and output the samples of the at least two different channels post multiplication to the corresponding DAC at different frequencies.

10. A multi-DAC system according to claim 1, wherein:
the circuit comprises a plurality of multipliers each of which is coupled to a different one of the plurality of DACs, each multiplier being operable to input the same version of the digital signal or a filtered version of the digital signal at a sampling frequency of Fs, multiply each successive group of M consecutive input samples by a multiplicand input to the multiplier which comprises a series of digital values and output the samples post multiplication to the corresponding DAC;
the peak of the frequency response of the multi-DAC system occurs at 0.5*N*Fs/M;
N corresponds to the number of DACs coupled in parallel; and
Fs corresponds to the sampling frequency of the plurality of DACs.

11. A multi-DAC system according to claim 10, wherein the multiplicand input to each of the plurality of multipliers comprises a constant series of +1 or −1 digital values.

12. A multi-DAC system according to claim 10, wherein the multiplicand input to each of the plurality of multipliers comprises a time-varying series of +1 and −1 digital values.

13. A multi-DAC system according to claim 12, wherein each multiplier has a different time-varying series of +1 and −1 digital values as the multiplicand input.

14. A multi-DAC system according to claim 10, wherein the digital signal comprises at least two different channels, and wherein each multiplier is operable to input the same version of the at least two different channels or a filtered version of the at least two different channels at the sampling frequency of Fs, multiply each successive group of M consecutive input samples of each channel by the same multiplicand input to the multiplier for each channel and output the samples of the at least two different channels post multiplication to the corresponding DAC at different frequencies.

15. A multi-DAC system according to claim 10, wherein the digital signal comprises at least two different channels, and wherein each multiplier is operable to input the same version of the at least two different channels or a filtered version of the at least two different channels at the sampling frequency of Fs, multiply each successive group of M consecutive input samples of each channel by a different multiplicand input to the multiplier for each channel, and output the samples of the at least two different channels post multiplication to the corresponding DAC at different frequencies.

16. A method of operating a multi-digital-to-analog converter (DAC) system, comprising:
converting a digital signal to an analog signal via a plurality of DACs arranged in parallel, each DAC path having a different analog phase response; and
multiplying the digital signal input to at least some of the DACs by a multiplicand sufficient to shift a peak of a frequency response of the multi-DAC system to a non-DC frequency.

17. A method according to claim 16, wherein the multiplicand comprises a series of +1 and −1 digital values.

18. A method according to claim 16, wherein each DAC has the same sampling frequency (Fs) and multiplying the digital signal input to at least some of the DACs comprises:
inputting the digital signal to a single multiplier at a sampling frequency of N*Fs;
alternating between multiplying each successive group of M consecutive input samples by a digital value of +1 or −1; and
outputting the samples post multiplication toward the plurality of DACs, wherein the peak of the frequency response of the multi-DAC system occurs at 0.5*N*Fs/M and N corresponds to the number of DACs coupled in parallel.

19. A method according to claim 16, wherein each DAC has the same sampling frequency (Fs) and multiplying the digital signal input to at least some of the DACs comprises:
coupling each of a plurality of multipliers to a different one of the plurality of DACs;

inputting the digital signal or a delayed version of the digital signal to each multiplier at a sampling frequency of Fs;

alternating between multiplying each successive group of M consecutive input samples by a digital value of +1 or −1 at each multiplier; and outputting the samples from each multiplier post multiplication to the corresponding DAC, wherein the peak of the frequency response of the multi-DAC system occurs at 0.5*N*Fs/M and N corresponds to the number of DACs coupled in parallel.

20. A method according to claim 19, wherein the digital signal comprises at least two different channels, and wherein each multiplier inputs the at least two different channels or a delayed version of the at least two different channels at the sampling frequency of N*Fs, alternates between multiplying each successive group of M consecutive input samples of each channel by the same digital value of +1 or −1 for each channel and outputs the samples of the at least two different channels post multiplication to the corresponding DAC at different frequencies.

21. A method according to claim 16, wherein each DAC has the same sampling frequency (Fs) and multiplying the digital signal input to at least some of the DACs comprises:

coupling each of a plurality of multipliers to a different one of the plurality of DACs;

inputting the same version of the digital signal or a filtered version of the digital signal to each multiplier at a sampling frequency of Fs;

multiplying each successive group of M consecutive input samples at each multiplier by a multiplicand input to each multiplier which comprises a series of digital values; and outputting the samples from each multiplier post multiplication to the corresponding DAC, wherein the peak of the frequency response of the multi-DAC system occurs at 0.5*N*Fs/M and N corresponds to the number of DACs coupled in parallel.

22. A method according to claim 21, wherein the multiplicand input to each of the plurality of multipliers comprises a constant series of +1 or −1 digital values.

23. A method according to claim 21, wherein the multiplicand input to each of the plurality of multipliers comprises a time-varying series of +1 and −1 digital values.

24. A method according to claim 23, wherein each multiplier has a different time-varying series of +1 and −1 digital values as the multiplicand input.

25. A method according to claim 21, wherein the digital signal comprises at least two different channels, and wherein each multiplier inputs the same version of the at least two different channels or a filtered version of the at least two different channels at the sampling frequency of Fs, multiplies each successive group of M consecutive input samples of each channel by the same multiplicand input to the multiplier for each channel and outputs the samples of the at least two different channels post multiplication to the corresponding DAC at different frequencies.

26. A method according to claim 21, wherein the digital signal comprises at least two different channels, and wherein each multiplier inputs the same version of the at least two different channels or a filtered version of the at least two different channels at the sampling frequency of Fs, multiplies each successive group of M consecutive input samples of each channel by a different multiplicand input to the multiplier for each channel, and outputs the samples of the at least two different channels post multiplication to the corresponding DAC at different frequencies.

* * * * *